United States Patent
Marrow et al.

(10) Patent No.: US 10,714,134 B2
(45) Date of Patent: Jul. 14, 2020

(54) APPROXIMATED PARAMETER ADAPTATION

(71) Applicant: Seagate Technology LLC, Cupertino, CA (US)

(72) Inventors: Marcus Marrow, San Jose, CA (US); Jason Bellorado, San Jose, CA (US); Vincent Brendan Ashe, San Jose, CA (US); Rishi Ahuja, Broomfield, CO (US)

(73) Assignee: Seagate Technology LLC, Fremont, CA (US)

( * ) Notice: Subject to any disclaimer, the term of this patent is extended or adjusted under 35 U.S.C. 154(b) by 6 days.

(21) Appl. No.: 15/793,870

(22) Filed: Oct. 25, 2017

(65) Prior Publication Data

US 2018/0367164 A1 Dec. 20, 2018

Related U.S. Application Data

(60) Provisional application No. 62/522,248, filed on Jun. 20, 2017.

(51) Int. Cl.
*G11B 5/00* (2006.01)
*G11B 5/596* (2006.01)
(Continued)

(52) U.S. Cl.
CPC ........ *G11B 5/59666* (2013.01); *G06F 13/102* (2013.01); *G06F 13/4221* (2013.01);
(Continued)

(58) Field of Classification Search
None
See application file for complete search history.

(56) References Cited

U.S. PATENT DOCUMENTS

| 4,984,101 A | 1/1991 | Kanota et al. |
| 5,321,564 A | 6/1994 | Takahashi |

(Continued)

OTHER PUBLICATIONS

Y. B. Nechaev, G. A. Kashenko and O. A. Plaksenko, "Increasing efficiency of information transmission with interference influence by the use of multi-parameter adaptation," East-West Design & Test Symposium (EWDTS 2013), Rostov-on-Don, 2013, pp. 1-4. (Year: 2013).*

(Continued)

*Primary Examiner* — Daniel F. McMahon
(74) *Attorney, Agent, or Firm* — Setter Roche LLP; Kirk A. Cesari (57) ABSTRACT

An apparatus can include a circuit configured to process an input signal using a set of channel parameters. The circuit can produce, using a first adaptation algorithm, a first set of channel parameters for use by the circuit as the set of channel parameters in processing the input signal. The circuit can further approximate a second set of channel parameters of a second adaptation algorithm for use by the circuit as the set of channel parameters in processing the input signal based on the first set of channel parameters and a relationship between a third set of channel parameters generated using the first adaptation algorithm and a fourth set of channel parameters generated using the second adaptation algorithm. In addition, the circuit can perform the processing of the input signal using the second set of channel parameters as the set of channel parameters.

13 Claims, 4 Drawing Sheets

(51) Int. Cl.

| | | |
|---|---|---|
| *G11B 20/10* | (2006.01) | |
| *H04L 25/03* | (2006.01) | |
| *G06F 13/10* | (2006.01) | |
| *G06F 13/42* | (2006.01) | |
| *H03K 5/131* | (2014.01) | |
| *H03M 1/00* | (2006.01) | |
| *H03M 13/41* | (2006.01) | |
| *H03K 5/135* | (2006.01) | |
| *H03L 7/07* | (2006.01) | |
| *H03L 7/081* | (2006.01) | |
| *H03L 7/091* | (2006.01) | |
| *H03G 3/20* | (2006.01) | |
| *H03M 1/12* | (2006.01) | |
| *H04L 7/00* | (2006.01) | |
| *H03M 13/29* | (2006.01) | |
| *H04B 1/7105* | (2011.01) | |
| *H03K 5/00* | (2006.01) | |
| *H04L 7/033* | (2006.01) | |

(52) U.S. Cl.
CPC ...... *G11B 5/59633* (2013.01); *G11B 20/1024* (2013.01); *G11B 20/10037* (2013.01); *G11B 20/10055* (2013.01); *G11B 20/10222* (2013.01); *H03K 5/131* (2013.01); *H03K 5/135* (2013.01); *H03L 7/07* (2013.01); *H03L 7/0814* (2013.01); *H03L 7/091* (2013.01); *H03M 1/001* (2013.01); *H03M 13/4146* (2013.01); *H04L 25/03019* (2013.01); *H03G 3/20* (2013.01); *H03K 2005/00019* (2013.01); *H03M 1/12* (2013.01); *H03M 13/2951* (2013.01); *H04B 1/71055* (2013.01); *H04L 7/0025* (2013.01); *H04L 7/0029* (2013.01); *H04L 7/0331* (2013.01)

(56) References Cited

U.S. PATENT DOCUMENTS

| | | |
|---|---|---|
| 5,461,644 A | 10/1995 | Bermans et al. |
| 5,543,978 A | 8/1996 | Park |
| 5,621,769 A | 4/1997 | Wan et al. |
| 5,654,765 A | 8/1997 | Kim |
| 5,742,532 A | 4/1998 | Duyne et al. |
| 5,862,192 A | 1/1999 | Huszar et al. |
| 5,970,093 A | 10/1999 | Lantremange |
| 6,111,712 A | 8/2000 | Vishakhadatta et al. |
| 6,157,510 A | 12/2000 | Schreck et al. |
| 6,181,213 B1 | 1/2001 | Chang |
| 6,222,592 B1 | 4/2001 | Patel |
| 6,320,920 B1 | 11/2001 | Beyke |
| 6,377,552 B1 | 4/2002 | Moran et al. |
| 6,396,887 B1 | 5/2002 | Ware et al. |
| 6,438,185 B1 | 8/2002 | Huttunen |
| 6,505,222 B1 | 1/2003 | Davis et al. |
| 6,519,107 B1 | 2/2003 | Ehrlich et al. |
| 6,549,587 B1 | 4/2003 | Li |
| 6,580,676 B1 | 6/2003 | Yanagisawa et al. |
| 6,581,182 B1 | 6/2003 | Lee |
| 6,633,894 B1 | 10/2003 | Cole |
| 6,665,308 B1 | 12/2003 | Rakib et al. |
| 6,670,901 B2 | 12/2003 | Brueske et al. |
| 6,687,073 B1 | 2/2004 | Kupferman |
| 6,697,891 B2 | 2/2004 | Emberty et al. |
| 6,707,772 B1 | 3/2004 | Marrec et al. |
| 6,738,205 B1 | 5/2004 | Moran et al. |
| 6,738,215 B2 | 5/2004 | Yatsu |
| 6,950,258 B2 | 9/2005 | Takaishi |
| 6,993,291 B2 | 1/2006 | Parssinen et al. |
| 7,046,701 B2 | 5/2006 | Mohseni et al. |
| 7,085,330 B1 | 8/2006 | Shirali |
| 7,133,233 B1 | 11/2006 | Ray et al. |
| 7,133,239 B1 | 11/2006 | Hartman et al. |
| 7,245,448 B2 | 7/2007 | Urata |
| 7,298,573 B2 | 11/2007 | Kitamura |
| 7,324,437 B1 | 1/2008 | Czylwik et al. |
| 7,362,432 B2 | 4/2008 | Roth |
| 7,440,208 B1 | 10/2008 | McEwen et al. |
| 7,929,238 B1 | 4/2011 | Vasquez |
| 7,940,667 B1 | 5/2011 | Coady |
| 7,948,703 B1 | 5/2011 | Yang |
| 8,027,117 B1 | 9/2011 | Sutardja et al. |
| 8,139,301 B1 | 3/2012 | Li et al. |
| 8,160,181 B1 | 4/2012 | Song et al. |
| 8,172,755 B2 | 5/2012 | Song et al. |
| 8,296,637 B1 | 10/2012 | Varnica et al. |
| 8,400,726 B1 | 3/2013 | Wu et al. |
| 8,441,751 B1 | 5/2013 | Song et al. |
| 8,456,977 B2 | 6/2013 | Honma |
| 8,479,086 B2 | 7/2013 | Xia et al. |
| 8,514,506 B1 | 8/2013 | Li et al. |
| 8,539,328 B2 | 9/2013 | Jin et al. |
| 8,542,766 B2 | 9/2013 | Chekhovstov et al. |
| 8,543,894 B1 | 9/2013 | Varnica et al. |
| 8,699,556 B1 * | 4/2014 | Sarrigeorgidis .... H04L 25/0224 375/232 |
| 8,713,413 B1 | 4/2014 | Bellorado et al. |
| 8,724,245 B1 | 5/2014 | Smith et al. |
| 8,755,139 B1 | 6/2014 | Zou et al. |
| 8,760,794 B1 | 6/2014 | Coker et al. |
| 8,767,341 B1 | 7/2014 | Coker et al. |
| 8,780,477 B1 | 7/2014 | Guo et al. |
| 8,837,068 B1 | 9/2014 | Liao et al. |
| 8,861,111 B1 | 10/2014 | Liao et al. |
| 8,861,112 B1 | 10/2014 | Pan et al. |
| 8,887,033 B1 | 11/2014 | Varnica et al. |
| 8,953,276 B1 | 2/2015 | Pokharel et al. |
| 9,007,707 B1 | 4/2015 | Lu et al. |
| 9,019,642 B1 | 4/2015 | Xia et al. |
| 9,025,269 B1 | 5/2015 | Wong et al. |
| 9,064,537 B1 | 6/2015 | Nie et al. |
| 9,082,418 B2 | 7/2015 | Ong et al. |
| 9,093,115 B1 | 7/2015 | Fung et al. |
| 9,099,132 B1 | 8/2015 | Grundvig et al. |
| 9,129,650 B2 | 9/2015 | Mathew et al. |
| 9,147,416 B2 | 9/2015 | Grundvig et al. |
| 9,189,315 B1 | 11/2015 | Varnica et al. |
| 9,196,298 B1 | 11/2015 | Zhang et al. |
| 9,239,754 B2 * | 1/2016 | Wu ..................... G06F 11/1048 |
| 9,245,579 B2 | 1/2016 | Song et al. |
| 9,245,580 B1 | 1/2016 | Lu et al. |
| 9,246,668 B1 | 1/2016 | Yu et al. |
| 9,257,135 B2 | 2/2016 | Ong et al. |
| 9,257,145 B1 | 2/2016 | Soderbloom et al. |
| 9,286,915 B1 | 3/2016 | Dziak et al. |
| 9,288,789 B2 * | 3/2016 | Nakashima .......... H04L 5/0048 |
| 9,311,937 B2 | 4/2016 | Zou et al. |
| 9,311,959 B1 | 4/2016 | Fan et al. |
| 9,385,757 B1 | 7/2016 | Nangare |
| 9,401,161 B1 | 7/2016 | Jury et al. |
| 9,424,878 B1 | 8/2016 | Dziak et al. |
| 9,431,052 B2 | 8/2016 | Oberg et al. |
| 9,489,976 B2 | 11/2016 | Jury et al. |
| 9,508,369 B2 | 11/2016 | Chu et al. |
| 9,536,563 B1 | 1/2017 | Liu et al. |
| 9,542,972 B1 | 1/2017 | Nayak et al. |
| 9,564,157 B1 | 2/2017 | Trantham |
| 9,590,803 B2 | 3/2017 | Derras et al. |
| 9,645,763 B2 | 5/2017 | Sankaranarayanan et al. |
| 9,672,850 B2 | 6/2017 | Grundvig et al. |
| 9,728,221 B2 | 8/2017 | Oberg et al. |
| 9,947,362 B1 | 4/2018 | Venkataramani et al. |
| 9,998,136 B1 | 6/2018 | Wu |
| 10,164,760 B1 | 12/2018 | Bellorado et al. |
| 10,177,771 B1 | 1/2019 | Bellorado et al. |
| 10,180,868 B2 | 1/2019 | Alhussien et al. |
| 10,276,197 B2 | 4/2019 | Bellorado et al. |
| 10,276,233 B1 | 4/2019 | Danjean et al. |
| 10,297,281 B1 | 5/2019 | Bellorado et al. |
| 10,469,290 B1 | 11/2019 | Marrow et al. |
| 10,498,565 B1 | 12/2019 | Azenkot et al. |
| 2002/0080898 A1 | 6/2002 | Agazzi et al. |

(56) References Cited

U.S. PATENT DOCUMENTS

| | | |
|---|---|---|
| 2002/0181439 A1 | 12/2002 | Orihashi et al. |
| 2003/0185114 A1 | 10/2003 | Liaw |
| 2003/0198152 A1 | 10/2003 | Morishima |
| 2003/0198165 A1 | 10/2003 | Mouri et al. |
| 2004/0028148 A1* | 2/2004 | Dowling .......... H04L 25/03343 375/296 |
| 2004/0101068 A1 | 5/2004 | Wang et al. |
| 2004/0228397 A1 | 11/2004 | Bach |
| 2005/0117243 A1 | 6/2005 | Serizawa |
| 2006/0215290 A1 | 9/2006 | Kurtas et al. |
| 2007/0139805 A1 | 6/2007 | Mead |
| 2007/0139806 A1 | 6/2007 | Southerland et al. |
| 2007/0177292 A1 | 8/2007 | Bui et al. |
| 2008/0007855 A1 | 1/2008 | Vityaev et al. |
| 2008/0158711 A1 | 7/2008 | Bliss et al. |
| 2008/0175309 A1 | 7/2008 | Fimoff et al. |
| 2009/0028252 A1 | 1/2009 | Lu |
| 2009/0097606 A1 | 4/2009 | Hutchins et al. |
| 2009/0141386 A1 | 6/2009 | Miura |
| 2009/0262870 A1 | 10/2009 | Ashbrook et al. |
| 2009/0323214 A1 | 12/2009 | Grundvig et al. |
| 2010/0290153 A1 | 11/2010 | Hampshire |
| 2011/0002375 A1 | 1/2011 | Honma |
| 2011/0072335 A1* | 3/2011 | Liu .................... H03M 13/1102 714/796 |
| 2011/0090773 A1 | 4/2011 | Yu et al. |
| 2011/0176400 A1 | 7/2011 | Gerasimov |
| 2012/0082018 A1 | 4/2012 | Gushima et al. |
| 2012/0105994 A1 | 5/2012 | Bellorado et al. |
| 2012/0155577 A1 | 6/2012 | Shukla et al. |
| 2013/0076433 A1 | 3/2013 | Fratti |
| 2013/0201838 A1 | 8/2013 | Homchaudhuri et al. |
| 2014/0009192 A1 | 1/2014 | Suzuki |
| 2014/0035638 A1 | 2/2014 | Bode |
| 2014/0079109 A1* | 3/2014 | Serbetli ................ H04L 25/067 375/224 |
| 2014/0223114 A1 | 8/2014 | Wang et al. |
| 2015/0003221 A1 | 1/2015 | Sankaranarayanan et al. |
| 2015/0279398 A1 | 10/2015 | Fan et al. |
| 2015/0355838 A1 | 12/2015 | Chen et al. |
| 2016/0112218 A1 | 4/2016 | Abe |
| 2016/0293205 A1 | 10/2016 | Jury et al. |
| 2016/0351227 A1 | 12/2016 | Koshino |
| 2017/0125089 A1 | 5/2017 | Sankaranarayanan et al. |
| 2017/0125110 A1 | 5/2017 | Sankaranarayanan et al. |
| 2017/0236592 A1 | 8/2017 | Alhussien et al. |
| 2017/0249206 A1 | 8/2017 | Jeong et al. |
| 2018/0011753 A1 | 1/2018 | Alhussien et al. |
| 2018/0012663 A1 | 1/2018 | Alhussien et al. |
| 2018/0062623 A1 | 3/2018 | Pagnanelli |
| 2018/0277158 A1 | 9/2018 | Kishino |
| 2018/0367164 A1 | 12/2018 | Marrow et al. |
| 2019/0130967 A1 | 5/2019 | Danjean et al. |
| 2020/0065262 A1 | 2/2020 | Bellorado |

OTHER PUBLICATIONS

Bellorado et al., "Target Parameter Adaptation", U.S. Appl. No. 15/334,167, filed Oct. 25, 2016, Seagate Technology LLC.

Guo, Yuanbin, "An Efficient Circulant MIMO Equalizer for CDMA Downlink: Algorithm and VLSI Architecture", Hindawi Publishing Corporation, 2006, pp. 1-18.

Hicks, James, "Overloaded Array Processing with Spatially Reduced Search Joint Detection", Virginia Polytechnic Institute & State University, May 10, 2000, pp. 1-144.

Mohammad, Maruf, "Blind Acquisition of Short Burst with Per-Survivor Processing (PSP)", Virginia Polytechnic Institute & State University, Nov. 26, 2002, pp. 1-127.

\* cited by examiner

APPROXIMATED PARAMETER ADAPTATION

SUMMARY

In certain embodiments, an apparatus may include a circuit configured to process an input signal using a set of channel parameters. The circuit may produce, using a first adaptation algorithm, a first set of channel parameters for use by the circuit as the set of channel parameters in processing the input signal. The circuit may further approximate a second set of channel parameters of a second adaptation algorithm for use by the circuit as the set of channel parameters in processing the input signal based on the first set of channel parameters and a relationship between a third set of channel parameters generated using the first adaptation algorithm and a fourth set of channel parameters generated using the second adaptation algorithm. In addition, the circuit may perform the processing of the input signal using the second set of channel parameters as the set of channel parameters.

In certain embodiments, a system may include a channel circuit configured to process an input signal using a set of parameters and an adaptation circuit configured to produce, using a first adaptation algorithm, a first set of channel parameters for use by the circuit as the set of channel parameters in processing the input signal. The adaptation circuit may be further configured to approximate a second set of channel parameters of a second adaptation algorithm for use by the channel circuit as the set of channel parameters in processing the input signal based on the first set of channel parameters and a relationship between a third set of channel parameters generated using the first adaptation algorithm and a fourth set of channel parameters generated using the second adaptation algorithm. In addition, the adaptation circuit may be configured to output the second set of channel parameters to the channel circuit for use as the set of channel parameters in processing the input signal.

In certain embodiments, a method may include producing, by a circuit configured to process an input signal using a set of channel parameters and using a first adaptation algorithm, a first set of channel parameters for use by the circuit as the set of channel parameters in processing the input signal. The method may further include approximating a second set of channel parameters of a second adaptation algorithm for use by the circuit as the set of channel parameters in processing the input signal based on the first set of channel parameters and a relationship between a third set of channel parameters generated using the first adaptation algorithm and a fourth set of channel parameters generated using the second adaptation algorithm. Additionally, the method may include performing the processing of the input signal using the second set of channel parameters as the set of channel parameters.

DETAILED DESCRIPTION

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally relates to parameter adaptation, and in some embodiments, the present disclosure may relates to approximating parameter adaptation for a first adaptation algorithm based on a change in parameters produced by a second adaptation algorithm.

Some systems, such as electrical, electronic, motor drive, processing, or other systems may receive a signal of interest and process that signal based on parameters. For example, a read channel of a communication system or a magnetic recording storage system may utilize adaptive parameters to process an input signal. In some systems, a detector may generate a data sequence based on an equalized sample sequence and adaptive parameters. An adaptation component may include various adaptive functions or algorithms for adapting the parameters of the detector. For example, the adaptive parameters may be coefficients or taps of the filter circuits of a soft-output Viterbi algorithm (SOVA) detector (e.g. of finite impulse response filters (FIRs) or of data-dependent FIRs (DDFIRs) of the SOVA detector) or parameters such as branch variances or branch biases of a SOVA detector.

Examples of types of adaptation algorithms may include Minimum Bit-Error Rate (MBER) adaptation, minimum mean squared error (MMSE) adaptation, least mean square adaptation, recursive least squares (RLS) adaptation, and similar adaptation algorithms.

In some embodiments, a first adaptation algorithm may be used to adapt a set of adaptive parameters under at least one set of circumstances (e.g. under normal operation). In at least some other circumstances, a second adaptation algorithm may be used to approximate the set of adaptive parameters for the first adaptation algorithm based on a predetermined relationship between the set of adaptive parameters as produced by the first adaptation algorithm and the set of adaptive parameters as produced by the second adaptation algorithm. For example, such an approximation may be performed under circumstances in which the first adaptation algorithm may be ill suited to handle or in which the first adaptation algorithm may provide erroneous updates.

An example of such a system is discussed below with regard to FIG. 1.

Figure 1:
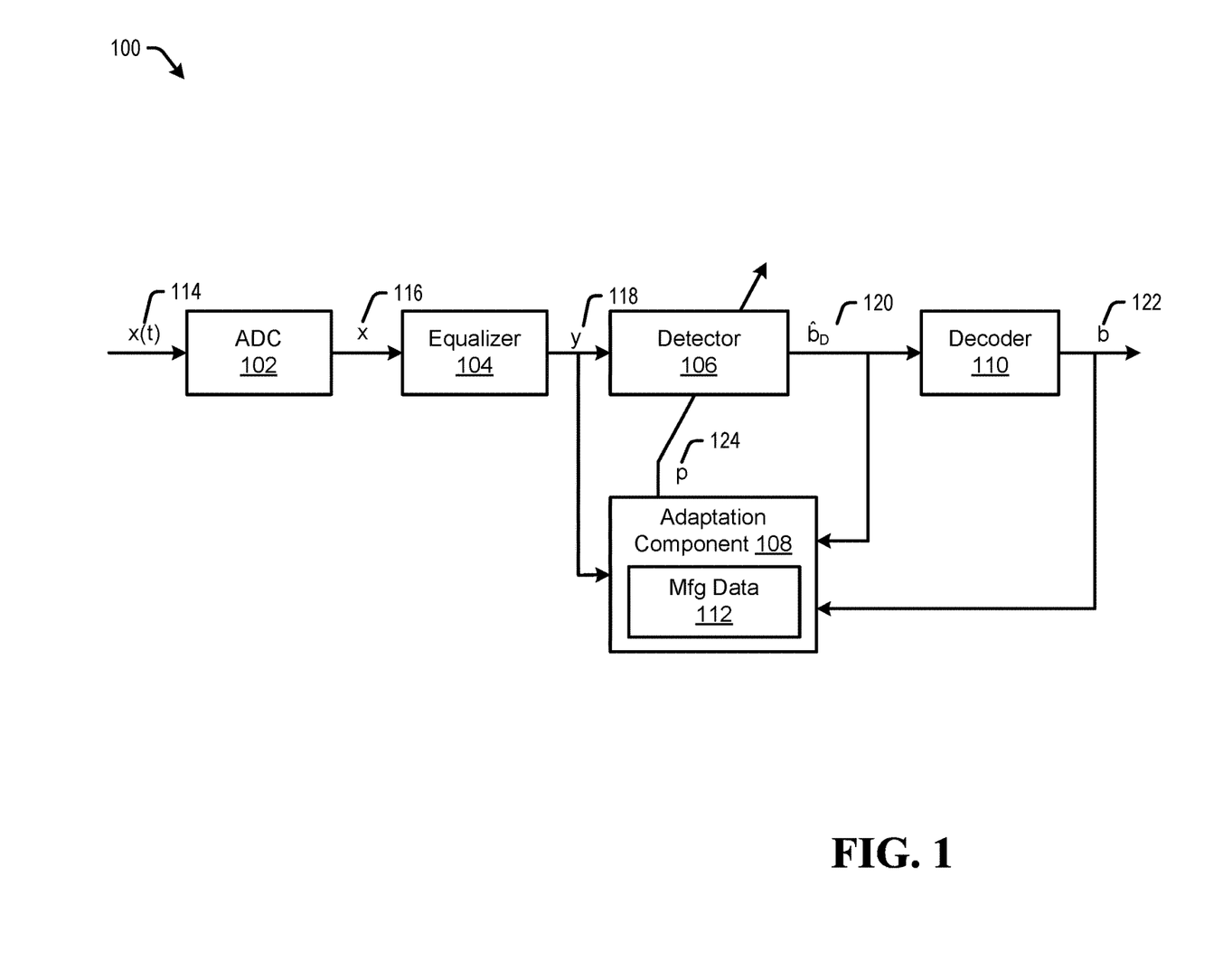
FIG. 1 is a block diagram of a communication channel which includes approximated parameter adaptation, in accordance with certain embodiments of the present disclosure.

Referring to FIG. 1, a block diagram of a communication channel which includes approximated parameter adaptation is shown and is generally designated 100. System 100 can include an analog-to-digital converter (ADC) 102 that may be coupled to an equalizer 104. The equalizer 104 may be coupled to a detector 106 and an adaptation component 108. The detector 106 may be coupled to a decoder 110 and the adaptation component 108. The adaptation component 108 may be connected to the detector 106. In addition, the decoder 110 may include an output from the communication channel 100 and be connected to the adaptation component 108. The adaptation component 108 may include a memory for storing manufacturing data 112 or access manufacturing data 112 stored in a separate memory (not shown).

Each of the ADC 102, equalizer 104, detector 106, adaptation component 108, and decoder 110 may be a separate circuit, a system on chip (SOC), firmware, a processor(s), or other system not listed, or any combination thereof.

As discussed in detail below, in the embodiment illustrated in FIG. 1, the parameters that are adapted are the parameters of the detector 106. While the discussion herein utilizes parameters of a detector of a read channel as examples, the disclosed techniques and systems may apply to other circuits or parameters. Many variations would be apparent to one of ordinary skill in the art in view of this disclosure.

In operation, the ADC 102 may sample a continuous-time signal x(t) 114 at regular intervals and may quantize the signal to produce a digitized sequence of samples x 116.

The equalizer 104 may receive the digitized sequence of samples x 116 and generate an equalized sample sequence y 118. In some examples, the equalizer may operate to shorten the intersymbol interference (ISI) length, or memory, of a channel. Further, the equalizer 102 may act to absorb variations in the input signal or noise statistics that may occur over time. In general, the equalizer 104 may produce a consistent, known, input signal to the detector 106 such that the detector 106 may estimate the data sequence corresponding to the signal x(t) 114 based on coefficients or parameters p 124 provided by the adaptation component 108.

The detector 106 may operate to determine (or estimate) a data sequence $\hat{b}_D$ 120 of bit values corresponding to the signal x(t) 114 based on the equalized sample sequence y 118 and the parameters or coefficients p 124 provided by the adaptation component 108. Specifically, the parameters p 124 may be provided to the detector to be used for estimation of the data sequence $\hat{b}_D$ 120. The data sequence $\hat{b}_D$ 120 may be representative of the probability that each bit is a zero or one. The values 124 may be represented as logs of the ratios of these probabilities and may be referred to as log likelihood ratios or LLRs. The detector 106 may act to generate the LLRs values based on knowledge of a channel response (e.g. the expected channel output for each possible written/transmitted data pattern). In some examples, the detector 108 may employ a Soft-Output Viterbi Algorithm (SOVA).

The generated data sequence $\hat{b}_D$ 120 may be passed to the decoder 110 which may generate decoded data b 122 if the data sequence $\hat{b}_D$ 120 is successfully decoded or extrinsic information or EXT (not shown) which may be representative of the probability that each bit is a zero or one. The decoder 110 may generate the decoded data b 122 or the EXT based on a structure of a utilized code. Though not shown for ease of illustration, in some implementations, the EXT may be returned to the detector (e.g. for use as part in an iterative decoding process being performed by the detector 106 and decoder 110).

The adaptation component 108 may operate to receive the equalized sample sequence y 118, the data sequence $\hat{b}_D$ 120 and the decoded data b 122 and adapt the parameters 124 of the detector 106.

More particularly, the detector 106 may be a SOVA detector. In some embodiments, the parameters 124 of the SOVA detector may be adapted using Minimum Bit-Error Rate (MBER) adaptation in normal operation. More particularly, MBER adaptation of the SOVA detector parameters may be run on sectors in normal operation which the decoder 110 can correctly decode the written data (e.g. thereby re-producing the written data and providing b 122 to the adaptation component). The decoded data b 122 may be fed back to the MBER adaptation together with the stored equalized sample sequence y 118 (or a subset of them).

In cases where MBER adaptation may be ill suited or in which the MBER adaptation may provide erroneous updates, approximated updated MBER parameters may be determined based on the set of adaptive parameters produced by an LMS adaptation algorithm and a predetermined relationship between the set of adaptive parameters as produced by the MBER and the set of adaptive parameters as produced by the LMS and stored as manufacturing data 112. For example, MBER adaptation may be ill suited or the MBER adaptation of detector parameters may provide erroneous updates when the decoder fails to decode the written data (b 122) and adaptation is to be performed using detector decision data ($\hat{b}_D$ 120) that may include bit errors (e.g. decision-directed adaptation). When performing decision-directed adaptation, the MBER cost function may cause the adaptive coefficients to move in such a way as to reinforce the decision errors, which may further degrade the detector performance. Other factors or conditions may also be used for triggering approximated MBER parameter generation. For example, the approximated MBER parameter generation may be triggered when a sector of interest has failed to decode after a threshold number of iterative decoding iterations and has sufficiently different noise statistics from adjacent sectors that adaptation on the adjacent sectors may not be useful.

The manufacturing data 112 may be generated during manufacturing or during a training process in the field. In the case of a hard disc drive or other devices whose parameters vary across the medium, the manufacturing data 112 may be generated for each storage unit (e.g. sectors, pages, etc.) or for larger regions or zones that may corresponding to groups of tracks (which is the case in the example discussed below). During generation of the manufacturing data, both MBER and LMS parameter sets may be generated using known write data. The generated parameter sets, information regarding relationships between the parameters sets (e.g. differences) or both may be stored.

In operation, when the decoder 110 fails to decode the data stored in a sector, the detector decisions 120 may be used to generate a current LMS parameter set. Then, in some embodiments, the difference between the MBER and LMS parameter sets generated in training and stored as manufacturing data 112 may be added to the current LMS parameter to generate approximated MBER parameters.

Application of this process to an example type of SOVA detector parameter is given below, specifically, for branch biases.

The branch metric in a log-domain Viterbi or SOVA may take the form:

$$bm = \left(\frac{1}{\sigma^2}\right)(z - z_t)^2,$$

where $\sigma^2$ may be the branch variance, z may be the DDFIR output for this branch (or FIR if there is no data dependent filtering) and $z_t$ may be the branch bias. With a MMSE cost function in LMS adaptation, $z_t = z_{avg} = E[z]$ (e.g. the branch mean may be conditioned on this being the correct branch). However, adapting with an MBER cost function may adapt $z_t$ away from $z_{avg}$ to minimize BER in the presence of complex noise statistics.

During manufacturing, for each zone, both the MBER parameter set $z_t$ and the measured MMSE parameter set $z_{avg}$ may be determined. The manufacturing parameters sets may be denoted as $z_t^{(m)}$ and $z_{avg}^{(m)}$.

When the decoder 110 fails to decode a particular sector in field operations, updated MBER parameters may allow the sector to be decoded. For example, where the failure to decode is due to track squeeze, it may be likely that the sector would decode if updated MBER parameters for this sector were used. However, MBER adaptation may not be used because the adaptation would be based on detector decisions which may include errors. Instead, the adaptation component 108 may generate or adapt current MMSE parameters $z_{avg}^{(f)}$ using the detector decisions. The adaptation component may then use the current MMSE parameters $z_{avg}^{(f)}$ to approximate the updated MBER parameters using:

$$z_t^{(f)} \approx z_t^{(m)} + (z_{avg}^{(f)} - z_{avg}^{(m)})$$

This may be effective because the difference between the MBER biases and MMSE biases may be the same for the manufacturing parameter sets as it is for the in-field error recovery parameter sets. As $z_t^{(m)}$ and $z_{avg}^{(m)}$ are stored in the manufacturing data 112 from the manufacturing process, the adaptation component can perform the approximation after computing $z_{avg}^{(f)}$ from detector decisions and the LMS algorithm. In some embodiments, the LMS adaptation may utilize total information from the decoder (e.g. LDPC sliced total information) which may be derived from the detector decisions and the extrinsic information.

Although the above examples compute the approximated parameters in response to a decoding failure, embodiments are not so limited. For example, the approximated parameters may be generated by the adaptation component 108 in an on-the-fly and continuing basis, and used based on a mode selection in the detector 106 or adaptation component 108 that may allow for use of the approximated parameters in response to triggering conditions (e.g. the decoder 110 failing to decode the sector thirty (30) times).

Figure 2:
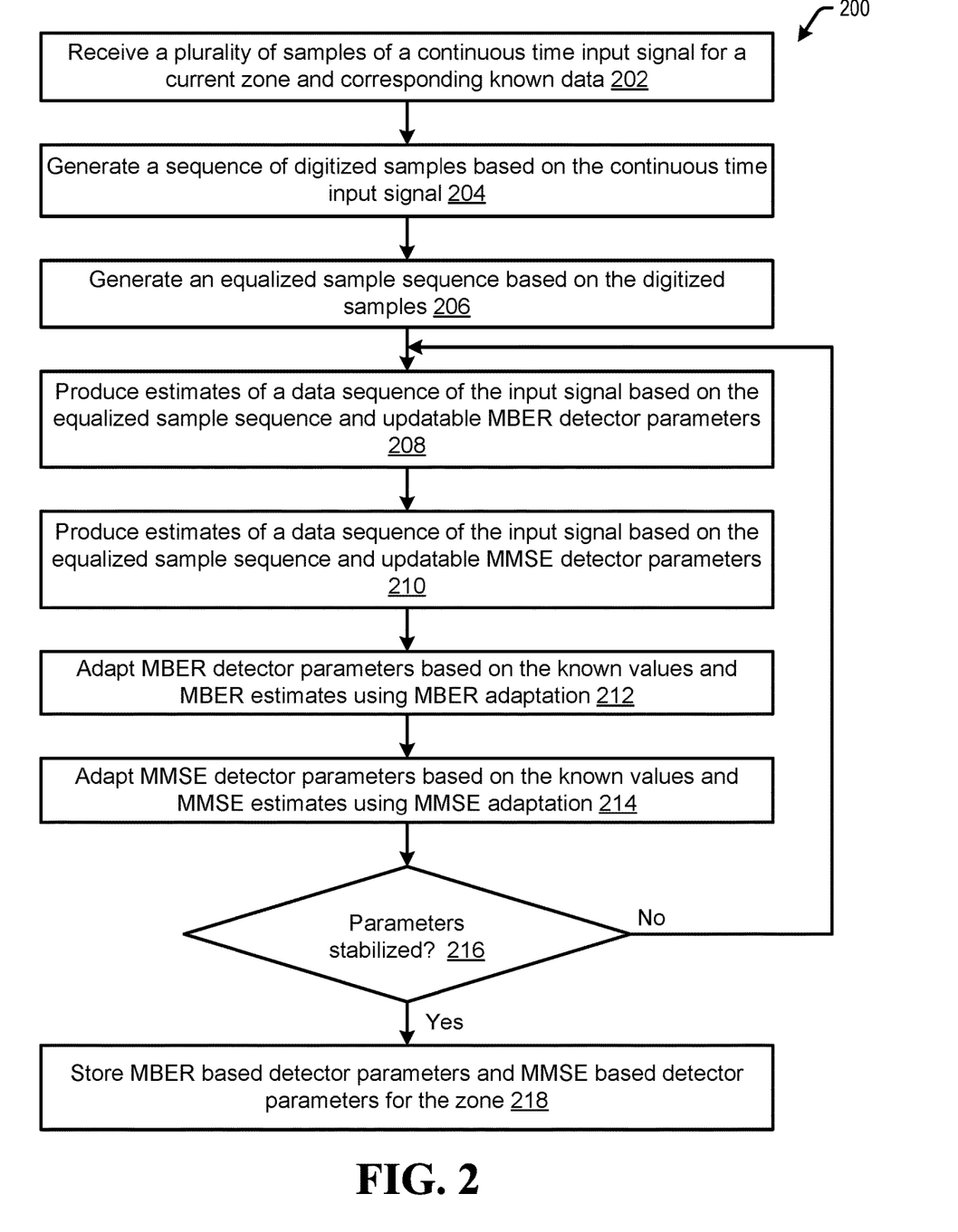
FIG. 2 is a flowchart of a method of approximated parameter adaptation, in accordance with certain embodiments of the present disclosure.

Referring to FIG. 2, a flowchart of a method of approximated parameter adaptation is shown and is generally designated 200. More particularly, flowchart 200 may be manufacturing or training operations to generate the manufacturing data 112 detailed above with respect to FIG. 1 for a current zone.

The system may receive a plurality of samples of a continuous time input signal for a current zone along with corresponding known data at 202. The system may then generate a sequence of digitized samples based on the continuous time input signal at 204. At 206, the system may generate an equalized sample sequence based on the digitized samples.

Next, the system may produce MBER based estimates of a data sequence of the input signal based on the equalized sample sequence and updatable MBER detector parameters at 208. At 210, the system may produce MMSE based estimates of a data sequence of the input signal based on the equalized sample sequence and updatable MMSE detector parameters. In some embodiments, the decoder may perform decoding operations for one or more of the MBER based estimates and the MMSE based estimates.

At 212, the system may perform an MBER based adaptation process on the MBER detector parameters based on the known values and MBER estimates. Then, at 214, the system may perform an MMSE based adaptation process on the MMSE detector parameters based on the known values and MMSE estimates.

The system may then determine if the MBER detector parameters and the MMSE detector parameters have stabilized at 216. If the parameters have stabilized, at 218, the system may store MBER based detector parameters and MMSE based detector parameters for the current zone (e.g. as manufacturing data 112). In some embodiments, the system may also determine and store relationship data (e.g. differences) between the MBER detector parameters and the MMSE detector parameters. Additionally or alternatively, some or all relationship data may be generated when the zone parameters are utilized. If the parameters have not stabilized, the system may return to 208 for additional adaptation operations. Though not shown, in some embodiments, additional operations, such as one or more of operations 202-206 may also be repeated when the parameters have not stabilized or the stability determination may be may be performed for new samples until the parameters have stabilized for general data samples of the zone.

Figure 3:
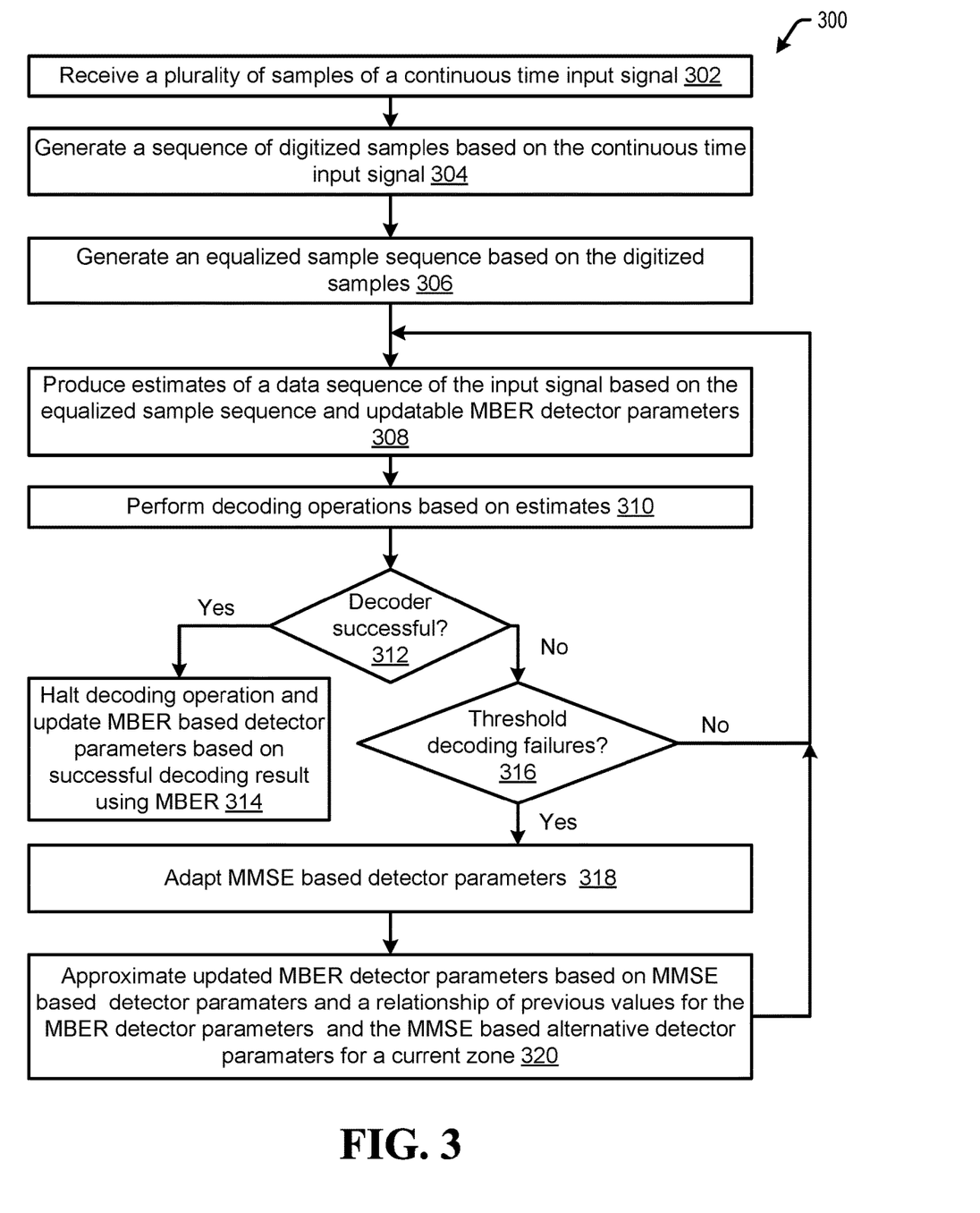
FIG. 3 is a flowchart of a method of approximated parameter adaptation, in accordance with certain embodiments of the present disclosure.

Referring to FIG. 3, a flowchart of a method of approximated parameter adaptation is shown and is generally designated 300. More particularly, flowchart 300 may be detection, decoding and approximated parameter adaptation during a read or receive operation and may be performed as detailed above with respect to FIG. 1.

In operation, at 302, the system may receive a plurality of samples of a continuous time input signal, for example, for a current data sector. At 304, the system may generate a sequence of digitized samples based on the continuous time input signal, for example, using an ADC. Next, the system may generate an equalized sample sequence based on the digitized samples at 306.

At 308, the system may produce estimates of a data sequence of the input signal based on the equalized sample sequence and updatable MBER detector parameter, for example, using a SOVA detector. Decoding operation may then be performed on the detector estimates at 310, for example, using a LDPC decoder.

At 312, the system may determine whether the decoder was successful. If so, the system may halt the operations for the current sector, output the decoded data sequence and update the MBER based detector parameters based on the successful decoded data sequence using MBER adaptation at 314. If the decoder was unsuccessful, the system may determine if a threshold number of decoding attempts have failed for the current sector at 316. If not, the system may return to 308 for an additional detection and decoding attempt. If a threshold number of decoding failures have occurred for the current sector, the system may begin approximated parameter adaptation at 318. More particularly, at 318, the system may adapt MMSE based detector parameters for the current sector by performing detection operations using the MMSE based detector parameters, performing decoding on the MMSE based detector estimates, and updating the MMSE based detector parameters using MMSE adaptation.

Next, at 320, the system may approximate updated MBER detector parameters based on MMSE based detector parameters and a relationship data of previous values for the MBER detector parameters and the MMSE based detector parameters for a current zone. For example, the approximate updated MBER detector parameters may generated by adding a difference between the previously generated and stored MBER detector parameters and the MMSE based detector parameters to the currently generated MMSE based detector parameters for the current sector as discussed above with regard to FIG. 1.

Then, at 322, the system may perform detector operations to produce estimates of a data sequence of the input signal based on the equalized sample sequence and the approximated updated MBER detector parameters and perform decoding operations based on estimates generated using the approximated updated MBER detector parameters (e.g. one or more iterative detection and decoding operations may be performed using the approximated updated MBER detector parameters). Though not shown, if the decoding operation at 322 is successful, the decoding result may be output for the current sector and MBER adaptation may be performed based on one or both of the approximated updated MBER detector parameters and the MBER detector parameters using the successful decoding result. If the decoding operation at 322 is unsuccessful, other recovery operations may be triggered or the process 300 may terminate in an error state.

All steps listed for the methods 200 and 300 may be applied to systems that have adaptive parameters. As mentioned above, other adaptation algorithms could be substituted for MBER and MMSE and these processes may be utilized for parameters of other circuits such as decoders, equalizers, ADCs and so on. Many other variations would be apparent in view of this disclosure. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

Figure 4:
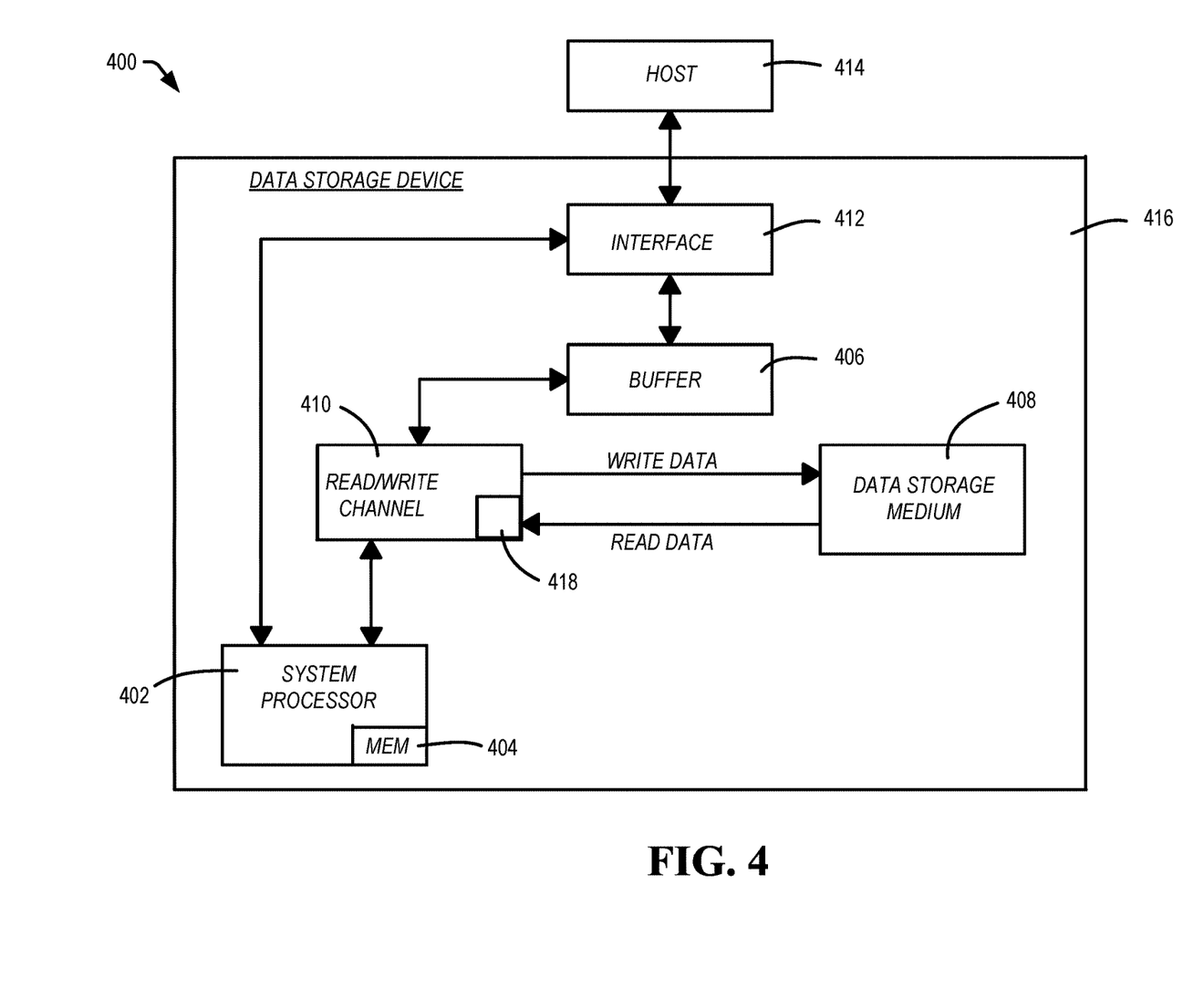
FIG. 4 is a block diagram of a system including approximated parameter adaptation, in accordance with certain embodiments of the present disclosure.

Referring to FIG. 4, a block diagram of a system including approximated parameter adaptation is shown and generally designated 400. The system 400 can be an example of a data storage device (DSD), and may be an example implementation of system 100. The DSD 416 can optionally connect to and be removable from a host device 414, which can be a device or system having stored data, such as a desktop computer, a laptop computer, a server, a digital video recorder, a photocopier, a telephone, a music player, other electronic devices or systems not listed, or any combination thereof. The data storage device 416 can communicate with the host device 414 via the hardware/firmware based host interface circuit 412 that may include a connector (not shown) that allows the DSD 416 to be physically connected and disconnected from the host 414.

The DSD 416 can include a system processor 402, which may be a programmable controller, and associated memory 404. The system processor 402 may be part of a system on chip (SOC). A buffer 406 may temporarily store data during read and write operations and can include a command queue. The read/write (R/W) channel 410 can encode data during write operations to, and reconstruct data during read operations from, the data storage medium 408. The data storage medium 408 is shown and described as a hard disc drive, but may be other types of magnetic medium, such as a flash medium, optical medium, or other medium, or any combination thereof.

The R/W channel 410 may receive data from more than one data storage medium at a time, and in some embodiments can also receive multiple data signals concurrently, such as from more than one output of a read head. For example, storage systems having two-dimensional magnetic recording (TDMR) systems can have multiple reading or recording elements, and can read from two tracks simultaneously or nearly simultaneously. Multi-dimensional recording (MDR) systems can receive two or more inputs from multiple sources (e.g. recording heads, flash memory, optical memory, and so forth). The R/W channel 410 can combine multiple inputs and provide a single output, as described in examples herein.

The block 418 can implement all of or part of the systems and functionality of systems and methods 100, 200, and 300. In some embodiments, the block 418 may be a separate circuit, integrated into the R/W channel 410, included in a system on chip, firmware, software, or any combination thereof.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
    a circuit including a Soft-Output Viterbi Algorithm (SOVA) detector configured to process an input signal using a selected set of channel parameters being branch biases of the SOVA detector, the circuit further configured to:
        produce, using a first adaptation algorithm, a first set of channel parameters for use by the circuit as the selected set of channel parameters in processing the input signal;
        approximate a second set of channel parameters of a second adaptation algorithm for use by the circuit as the selected set of channel parameters in processing the input signal based on the first set of channel parameters and a relationship between a third set of channel parameters generated using the first adaptation algorithm and a fourth set of channel parameters generated using the second adaptation algorithm;

process the input signal using the second set of channel parameters as the selected set of channel parameters; and the first adaptation algorithm being a minimum mean squared error (MMSE) adaptation algorithm and the second adaptation algorithm being a Minimum Bit-Error Rate (MBER) adaptation algorithm.

2. The apparatus of claim 1, further comprising a memory storing the third set of channel parameters generated using the first adaptation algorithm and the fourth set of channel parameters generated using the second adaptation algorithm.

3. The apparatus of claim 1 further comprising the circuit further including a detector that performs the processing of the input signal using the selected set of channel parameters, the circuit further configured to:

perform processing of the input signal using a fifth set of channel parameters generated using the second adaptation algorithm as the selected set of channel parameters in processing the input signal to produce a detection result;

determine that a decoding of one or more detection results produced by the detector using the fifth set of channel parameters has failed a threshold number of times; and at least partly in response to the determining the decoding has failed the threshold number of times, perform the processing of the input signal using the second set of channel parameters as the selected set of channel parameters.

4. The apparatus of claim 3, further comprising the circuit configured to:

determine that a decoding of one or more detection results produced by the detector using the second set of channel parameters has succeeded; and at least partly in response to the determining the decoding has succeeded, adapt, using the second adaptation algorithm, the second set of channel parameters using the successful decoding result.

5. The apparatus of claim 1, further comprising the circuit further including a detector that performs the processing of the input signal using the selected set of channel parameters, the circuit further configured to:

perform processing of the input signal using a fifth set of channel parameters generated using the second adaptation algorithm as the selected set of channel parameters in processing the input signal to produce a detection result;

determine that a decoding of one or more detection results produced by the detector using the fifth set of channel parameters has succeeded after less than a threshold number of failures; and at least partly in response to the determining the decoding has succeeded, adapt, using the second adaptation algorithm, the fifth set of channel parameters using the successful decoding result.

6. The apparatus of claim 1, further comprising:

a memory storing the third set of channel parameters generated using the first adaptation algorithm and the fourth set of channel parameters generated using the second adaptation algorithm;

the input signal being a readback signal read from a sector of a magnetic storage medium; and the third set of channel parameters and the fourth set of channel parameters corresponding to an area of the magnetic storage medium including the sector and being generated during a manufacturing process including reading back known data written to the area of the magnetic storage medium including the sector.

7. A system comprising:

a channel circuit including a Soft-Output Viterbi Algorithm (SOVA) detector configured to process an input signal using a selected set of parameters being branch biases of the SOVA detector;

an adaptation circuit configured to:

produce, using a first adaptation algorithm, a first set of channel parameters for use by the circuit as the selected set of parameters in processing the input signal;

approximate a second set of channel parameters of a second adaptation algorithm for use by the channel circuit as the selected set of parameters in processing the input signal based on the first set of channel parameters and a relationship between a third set of channel parameters generated using the first adaptation algorithm and a fourth set of channel parameters generated using the second adaptation algorithm; and output the second set of channel parameters to the channel circuit as the selected set of parameters to process the input signal with; and the first adaptation algorithm being a MMSE adaptation algorithm and the second adaptation algorithm being a MBER adaptation algorithm.

8. The system of claim 7 further comprising:

a memory storing the third set of channel parameters generated using the first adaptation algorithm and the fourth set of channel parameters generated using the second adaptation algorithm;

the input signal being a digitized sample sequence corresponding to a sector of a magnetic storage medium; and the third set of channel parameters and the fourth set of channel parameters corresponding to an area of the magnetic storage medium including the sector and being generated during a manufacturing process including reading back known data written to the area of the magnetic storage medium including the sector.

9. The system of claim 8 further comprising:

an analog-to-digital converter (ADC) circuit configured to generate one or more ADC samples based on an readback signal corresponding to the sector;

an equalizer circuit configured to receive digital samples from the ADC circuit and to equalize the digital samples to generate the digitized sample sequence; and a decoder configured to receive an output of the SOVA detector processing the input signal using the set of parameters and to perform decoding on the output of the SOVA detector.

10. The system of claim 7 further comprising the channel circuit being a detector and the adaptation circuit being further configured to:

output a fifth set of channel parameters to the channel circuit for use as the selected set of parameters in processing the input signal to produce one or more detection results, the fifth set of channel parameters generated using the second adaptation algorithm;

determine that a decoding of the one or more detection results produced by the detector using the fifth set of channel parameters has failed a threshold number of times; and at least partly in response to the determining the decoding has failed the threshold number of times, perform the processing of the input signal using the second set of channel parameters as the selected set of parameters.

11. The system of claim 7 further comprising the channel circuit being a detector and the adaptation circuit being further configured to:
output a fifth set of channel parameters to the channel circuit for use as the selected set of parameters in processing the input signal to produce one or more detection results, the fifth set of channel parameters generated using the second adaptation algorithm;
determine that a decoding of the one or more detection results produced by the detector using the fifth set of channel parameters has succeeded after less than a threshold number of failures; and
at least partly in response to the determining the decoding has succeeded, adapt, using the second adaptation algorithm, the fifth set of channel parameters using the successful decoding result.

12. A method comprising:
producing, by a circuit including a Soft-Output Viterbi Algorithm (SOVA) detector configured to process an input signal using a selected set of channel parameters and using a first adaptation algorithm, a first set of channel parameters for use by the circuit as the selected set of channel parameters as branch biases of the SOVA detector to perform processing of the input signal;
approximating a second set of channel parameters of a second adaptation algorithm for use by the circuit as the selected set of channel parameters in processing the input signal based on the first set of channel parameters and a relationship between a third set of channel parameters generated using the first adaptation algorithm and a fourth set of channel parameters generated using the second adaptation algorithm;
processing the input signal using the second set of channel parameters as the selected set of channel parameters; and
the first adaptation algorithm being a minimum mean squared error (MMSE) adaptation algorithm and the second adaptation algorithm being a Minimum Bit-Error Rate (MBER) adaptation algorithm.

13. The method of claim 12 further comprising:
the input signal being a digitized sample sequence corresponding to a sector of a magnetic storage medium;
the third set of channel parameters and the fourth set of channel parameters corresponding to an area of the magnetic storage medium including the sector and being generated during a manufacturing process including reading back known data written to the area of the magnetic storage medium including the sector; and
the relationship between the third set of channel parameters and the fourth set of channel parameters being a difference.

* * * * *